United States Patent
Liu et al.

(10) Patent No.: US 7,417,907 B1
(45) Date of Patent: Aug. 26, 2008

(54) SYSTEMS AND METHODS FOR RESOLVING MEMORY ADDRESS COLLISIONS

(75) Inventors: Zhen W. Liu, Sunnyvale, CA (US);
Kenway Tam, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/021,497

(22) Filed: Dec. 23, 2004

(51) Int. Cl.
*G11C 7/00* (2006.01)

(52) U.S. Cl. ............ 365/196; 365/189.04; 365/189.07; 365/230.05

(58) Field of Classification Search ............ 365/189.04, 365/189.07, 230.05, 195, 196
See application file for complete search history.

(56) References Cited

U.S. PATENT DOCUMENTS

| | | | | |
|---|---|---|---|---|
| 4,599,708 A | * | 7/1986 | Schuster | 365/174 |
| 5,062,081 A | * | 10/1991 | Runaldue | 365/230.05 |
| 5,280,449 A | * | 1/1994 | Oldham | 365/189.02 |
| 5,742,180 A | | 4/1998 | DeHon et al. | |
| 5,752,259 A | | 5/1998 | Tran | |
| 5,802,579 A | * | 9/1998 | Crary | 711/149 |
| 5,841,304 A | | 11/1998 | Tam | 327/161 |
| 5,844,856 A | * | 12/1998 | Taylor | 365/230.05 |
| 5,900,759 A | | 5/1999 | Tam | 327/201 |
| 5,953,284 A | | 9/1999 | Baker et al. | |
| 6,101,135 A | * | 8/2000 | Lee | 365/191 |
| 6,138,206 A | | 10/2000 | Fisher et al. | |
| 6,275,437 B1 | * | 8/2001 | Kim et al. | 365/222 |
| 6,320,794 B1 | * | 11/2001 | Kang et al. | 365/189.02 |
| 6,393,512 B1 | | 5/2002 | Chen et al. | |
| 6,584,531 B1 | | 6/2003 | Singh | |
| 2003/0005225 A1 | | 1/2003 | Smits | |

OTHER PUBLICATIONS

Stewart, Robert W. Lecture slides entitled, "Digital Logic Review." Jan. 2004. Retrieved from http://www.eee.strath.ac.uk/r.w.stewart/digital/logic_review.pdf.*
Kaplan et al. Hands-on Electronics: A One-semester Course for Class Instruction or Self-study. Published: 2003. Cambridge University Press. pp. 125-136.*
U.S. Appl. No. 11/035,594, filed Jan. 14, 2005, Shin et al.

* cited by examiner

*Primary Examiner*—J. H. Hur
*Assistant Examiner*—Alexander Sofocleous
(74) *Attorney, Agent, or Firm*—Martine Penilla & Gencarella, LLP

(57) ABSTRACT

A hardware implemented method for resolving collisions of memory addresses of a memory array is provided. In this hardware implemented method, a read memory address is compared with a write memory address. If the read and write memory addresses match, write data is directed from a data input to a data output, whereby the data input is further configured to input the write data to the memory array. A system and a memory chip for resolving collisions of memory addresses of a memory array are also described.

15 Claims, 6 Drawing Sheets

SYSTEMS AND METHODS FOR RESOLVING MEMORY ADDRESS COLLISIONS

BACKGROUND OF THE INVENTION

1. Field of the Invention

This invention relates generally to computer storage and, more particularly, to systems and methods for resolving memory address collisions.

2. Description of the Related Art

When a memory is accessed to read or write data, a read memory address or write memory address is received by the memory to read from the read address or write to the write memory address, respectively. Typically, if data is read from and written to the same location in memory, the memory outputs indeterministic (i.e., erroneous) data. Since indeterministic data is unpredictable, the indeterministic data creates unpredictability in downstream logic. For example, if erroneous data is fed into an adder within a microprocessor, the adder will output erroneous results.

To avoid having the erroneous data corrupt any downstream state machines, logic is typically implemented external to the memory to handle the indeterministic data. However, the inclusion of the external logic to handle the indeterministic data slows the access of data and requires more integrated logic and space on hardware that accesses the data.

In view of the foregoing, there is a need to provide faster and simpler systems and methods to resolve indeterministic data from memory address collisions.

SUMMARY OF THE INVENTION

Broadly speaking, the present invention fills these needs by providing systems and hardware implemented methods for resolving collisions of memory addresses of a memory array. It should be appreciated that the present invention can be implemented in numerous ways, including as a method, a system, or a device. Several inventive embodiments of the present invention are described below.

In accordance with a first aspect of the present invention, a hardware implemented method for resolving collisions of memory addresses of a memory array is provided. In this hardware implemented method, a read memory address is compared with a write memory address. If the read and write memory addresses match, write data is directed from a data input to a data output, whereby the data input is further configured to input the write data to the memory array.

In accordance with a second aspect of the present invention, a memory chip having circuitries for resolving collisions of memory addresses of a memory array is provided. The memory chip includes circuitry for comparing a read memory address with a write memory address, and circuitry for disabling a sense amplifier to allow write data to bypass from a data input to a data output through a bypass circuitry if the read and write memory addresses match. The data input is further configured to input the write data to the memory array.

In accordance with a third aspect of the present invention, a system for resolving collisions of memory addresses of a memory array is provided. The system includes a memory that includes memory arrays, whereby each of the memory array includes a sense amplifier and bypass circuitry. The sense amplifier and bypass circuitry includes a first gate and a comparator in communication with the first gate. Additionally included is a sense amplifier in communication with the first gate and the comparator, and a second gate in communication with the first gate and the sense amplifier.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for systems and hardware implemented methods for resolving collisions of memory addresses of a memory array. It will be obvious, however, to one skilled in the art, that the present invention may be practiced without some or all of these specific details. In other instances, well known process operations have not been described in detail in order not to unnecessarily obscure the present invention.

The embodiments described herein provide a system, a memory chip, and hardware implemented methods for resolving collisions of memory addresses of a memory array. Essentially, if data is read from and written to the same location in memory, then the read data from the memory is blocked from being outputted, and the write data is directed from a data input to a data output. As will be explained in more detail below, a bypass circuitry, which basically connects the data input to the data output, allows the write data to be directed to the data output.

Figure 1:
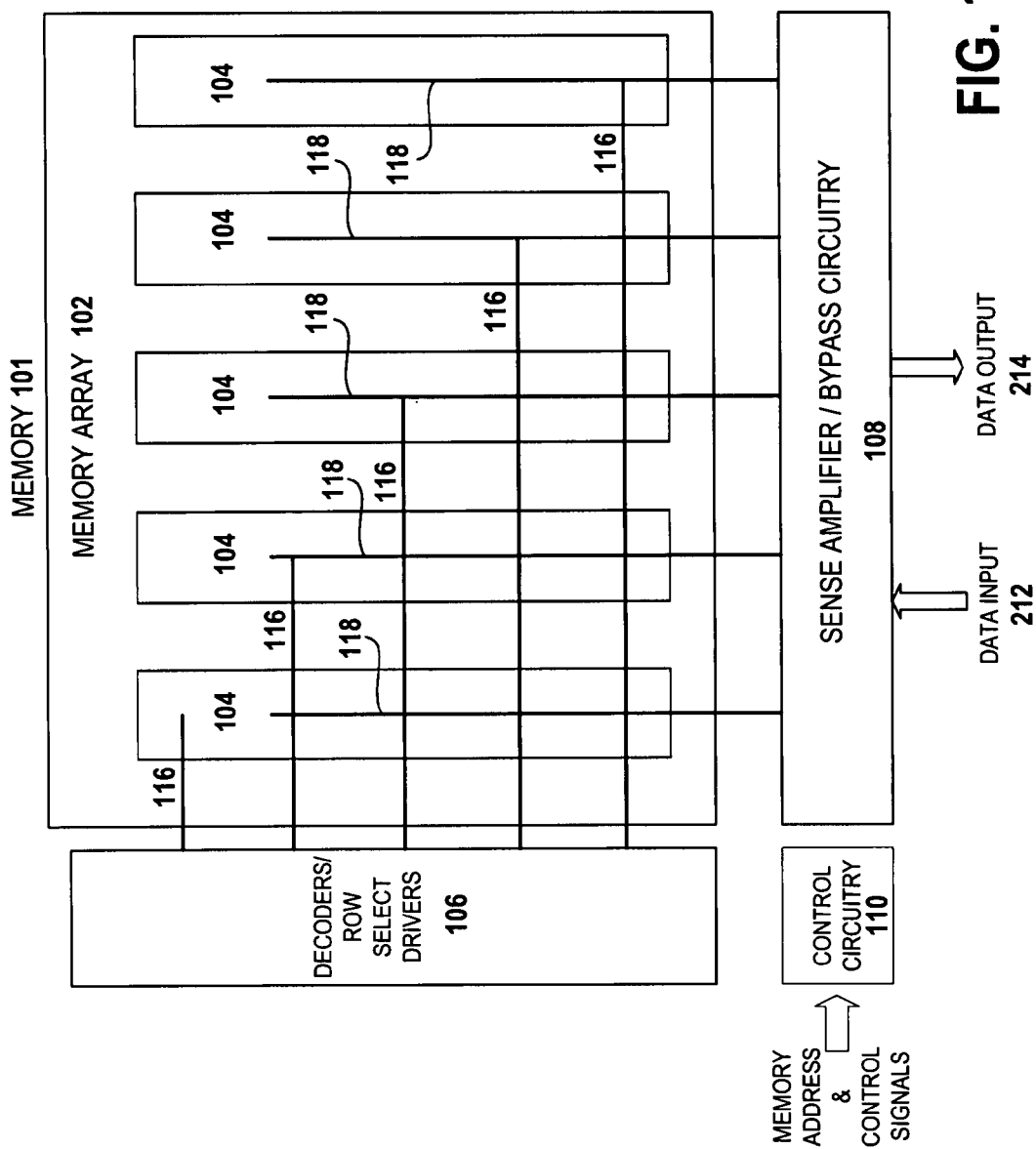
FIG. 1 is a simplified block diagram of a high level system overview of a memory for resolving collisions of memory addresses of a memory array, in accordance with one embodiment of the present invention.

FIG. 1 is a simplified block diagram of a high level system overview of a memory for resolving collisions of memory addresses of a memory array, in accordance with one embodiment of the present invention. As shown in FIG. 1, memory 101 includes memory array 102, decoders and row select drivers 106, sense amplifier and bypass circuitry 108, and control circuitry 110. Memory array 102 is a large collection of memory cells that define the size of memory 101. The memory cells store information, such as instructions and data, as digital information having a logical one or a logical zero value. A logical one corresponds to a high voltage level while a logical zero corresponds to a low voltage level. The memory cells are arranged in rows and columns 104. Memory 101 also has a grid of bit lines 118 and word lines 116, with memory cells located at intersections of the bit lines and the word lines.

In communication with memory array 102 are decoders and row select drivers 106, control circuitry 110, and sense amplifier and bypass circuitry 108. To access information stored in memory array 102, control circuitry 110 receives memory addresses and control signals. It should be appreciated that a memory address is a unique identifier for a memory location at which a central processing unit (CPU) or other device can store or read data. During operation, bit lines 118 and word lines 116 are selectively asserted and negated by decoders and row select drivers 106 and sense amplifier and bypass circuitry 108 to enable at least one of the memory cells to be read or written. Sense amplifier and bypass circuitry 108 receives write data through data input 212 during data write operations, and outputs read data through data output 214 during data read operations. As will be explained in more detail below, sense amplifier and bypass circuitry 108 include the circuitry to resolve collisions of memory addresses. Decoders and row select drivers 106, control circuitry 110, and sense amplifier and bypass circuitry 108 may additionally include, for example, latches, clock signal generators, and multiplexers used to record write data to and retrieve read data from memory array 102.

It should be appreciated that memory 101 may be present within a microprocessor (e.g., Level 1 or Level 2 cache). In alternative embodiments, memory 101 may be part of another type of device, such as a controller or a stand alone memory structure.

Figure 2:
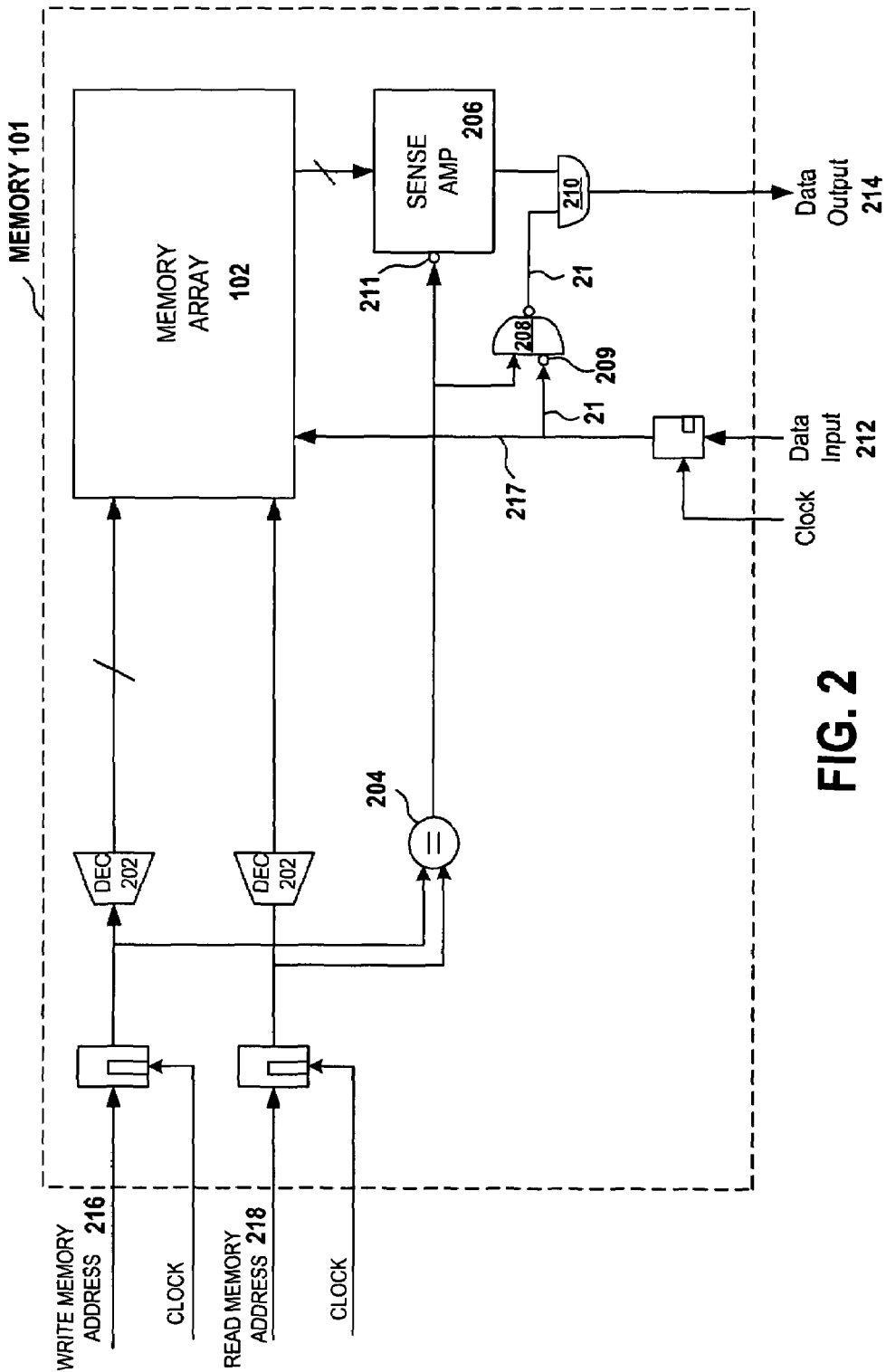
FIG. 2 is a simplified schematic diagram of a memory for resolving collisions of memory addresses of a memory array, in accordance with one embodiment of the present invention.

FIG. 2 is a simplified schematic diagram of a memory for resolving collisions of memory addresses of a memory array, in accordance with one embodiment of the present invention. FIG. 2 shows memory array 102 in communication with decoders 202, comparator 204, first inverter 211, sense amplifier 206, second inverter 209, NAND gate 208, and AND gate 210. When memory array 102 is accessed, comparator 204 compares inputted write memory address 216 and read memory address 218. Comparator 204 may be any suitable device that compares two voltages or currents, and switches its output to indicate whether the two voltages or currents are equal or not equal. Depending on the size of memory array 102, exemplary embodiments of comparator 204 include a five-bit comparator, a six-bit comparator, a seven-bit comparator, etc. In one embodiment, comparator 204 may be a separate device, as shown in FIG. 2. In another embodiment, comparator 204 may be integrated with decoders 202. It should be appreciated that decoders 202 are optional. For example, if write memory address 216 and read memory address 218 are fully decoded, then wordline drivers may replace decoders 202.

Sense amplifier 206 is used to quickly sense the voltage difference that occurs on bit lines during a read operation. In other words, sense amplifier 206 amplifies the read data signals from memory array 102. It should be appreciated that FIG. 2 illustrates a portion of memory 101, as there is typically one sense amplifier per memory column. Accordingly, memory 101 may include a number of sense amplifiers, whereby sense amplifier 206 and the bypass circuitry shown in FIG. 2 may be repeated for each memory column.

A memory collision occurs when write memory address 216 and read memory address 218 match. Essentially, when there is a collision of the memory addresses, the output of comparator 204 disables sense amplifier 206. Accordingly, data output 214 is blocked from outputting read data from memory array 102. At the same time, NAND gate 208 and AND gate 210 are opened and, as a result, write data being inputted through data input 212 is directed to data output 214 along communication path 21. In addition to being directed to data output 214, the write data still is inputted to memory array 102 along communication path 217 for recording at write address 216. Thus, when a memory collision occurs, the read data is blocked from being outputted through data output 214 and, instead, write data is directed to data output 214. Unlike read data, write data is not blocked and is also recorded to memory array 102.

Specifically, comparator 204 receives write memory address 216 and read memory address 218 as inputs and compares the memory addresses. If write memory address 216 and read memory address 218 match, then comparator 204 outputs a 1 value (i.e., a high value), in accordance with one embodiment of the present invention. First inverter 211 inverts the 1 value from comparator 204 to a 0 value, which disables sense amplifier 206. At the same time, second inverter 209 inverts the 1 output value from comparator 204 to a 0 value (i.e., a low value). The 0 value in combination with the 1 value open NAND gate 208, thereby allowing write data from data input 212 to pass through the NAND gate. When sense amplifier 206 is disabled, the sense amplifier outputs a 1 value to open AND gate 210, thereby allowing the write data outputted from NAND gate 208 to bypass from data input 212 to data output 214.

On the other hand, if write memory address 216 and read memory address 218 differ, then there is no collision. As such, in one embodiment, when there is no collision, comparator 204 outputs a 0 value that enables sense amplifier 206 but disables NAND gate 208. The enabled sense amplifier 206 amplifies the read data signal from memory array 102, thereby allowing data output 214 to output the read data from the memory array at read memory address 218. At the same time, write data is inputted through data input 212 for recording to a different write memory address 216.

Figure 3:
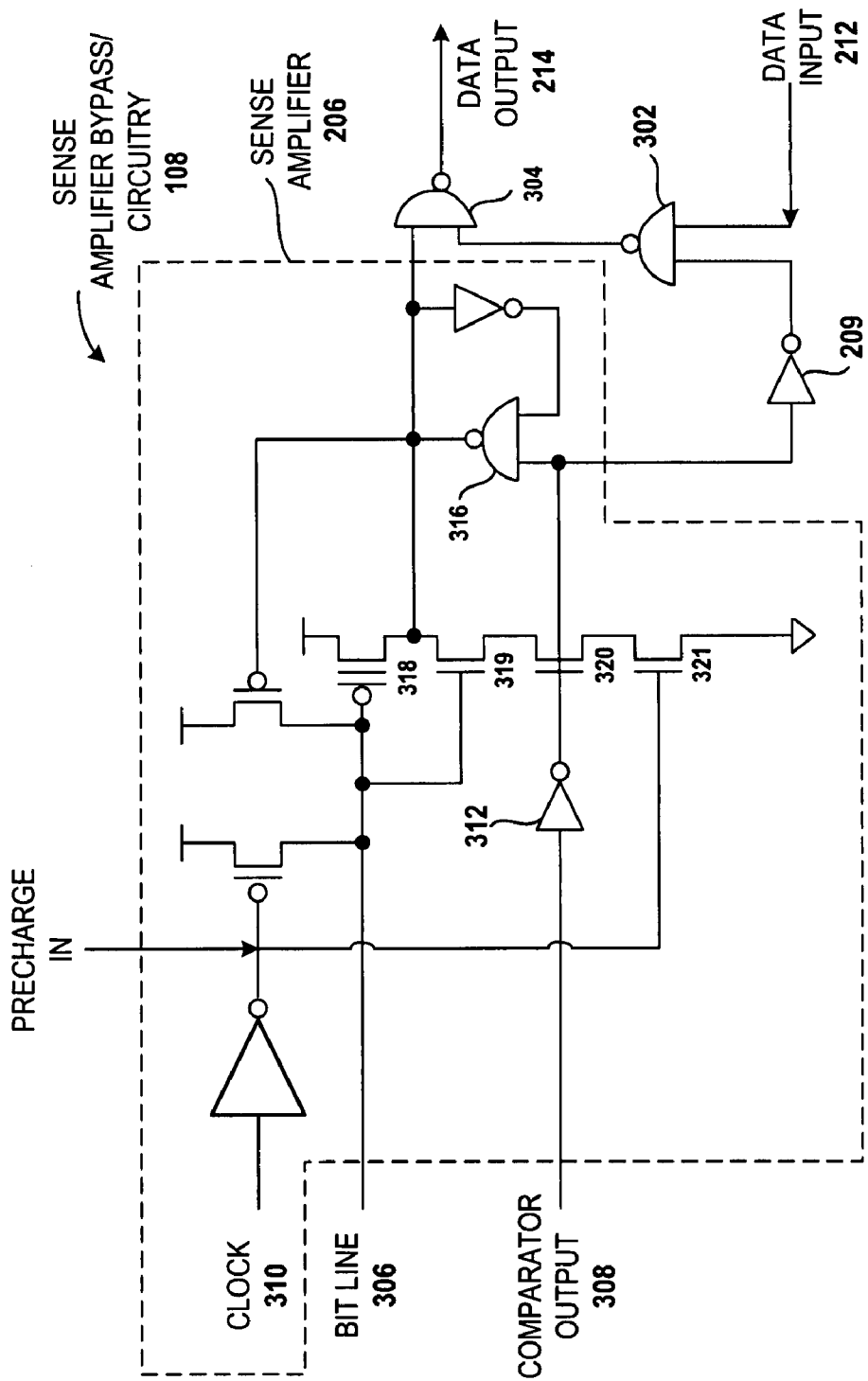
FIG. 3 is a more detailed schematic diagram of sense amplifier and bypass circuitry shown in FIGS. 1 and 2, in accordance with one embodiment of the present invention.

FIG. 3 is a more detailed schematic diagram of the sense amplifier and bypass circuitry shown in FIGS. 1 and 2, in accordance with one embodiment of the present invention. As shown in FIG. 3, sense amplifier and bypass circuitry 108 includes sense amplifier 206, first NAND gate 302, second NAND gate 304, and second inverter 209. Sense amplifier 206 includes third inverter 312, positive-channel metal-oxide semiconductor (PMOS) transistor 318, third NAND gate 316, first negative-channel metal-oxide semiconductor (NMOS) transistor 319, second nMOS transistor 320, and third nMOS transistor 321. Although FIG. 3 shows that bypass circuitry, which connects data input 212 to data output 214, includes the use of first NAND gate 302 and second NAND gate 304, the two NAND gates may be substituted with a NAND gate and an AND gate, in accordance with another embodiment of the present invention.

As shown in FIG. 3, second NAND gate 304 is in communication with sense amplifier 206 and first NAND gate 302. The output of second NAND gate 304 is data output 214. First NAND gate 302 also is in communication with sense amplifier 206 and second NAND gate 304, with data input 212 as input. Inputs to sense amplifier 206 include comparator output 308, which is the output from a comparator, and bit line 306 (i.e., output from memory array).

In one embodiment, if there is a collision of memory addresses, sense amplifier 206 receives a 1 value from comparator output 308, and third inverter 312 inverses the 1 value to a 0 value. Second inverter 209 receives the 0 value and outputs a 1 value. The output 1 value from second inverter 209 opens first NAND gate 302, thereby allowing write data to pass through the first NAND gate. At the same time, third NAND gate 316 receives the 0 value from third inverter 312 and outputs a 1 value. The 1 value from third NAND gate 316 opens second NAND gate 304, thereby allowing the write data to bypass from data input 212 to data output 214. Further, the 0 output value from third inverter 312 turns off second nMOS 320. As a result, bit line 306 can only flow through pMOS 318, which is either off or generates a 1 value (same value as the output from third NAND gate 316). In effect, when there is a collision, sense amplifier 206 is disabled to allow write data to bypass from data input 212 to data output 214.

On the other hand, if there is no collision of memory addresses, sense amplifier 206 receives a 0 value from comparator output 308 and third inverter 312 outputs a 1 value. Second inverter 209 receives the 1 value and outputs a 0 value. The output 0 value from second inverter 209 closes first NAND gate 302, thereby blocking write data from passing through the bypass circuitry to data output 214. At the same time, the 1 value from comparator output 308 allows read data from bit line 306 to flow through pMOS transistor 318 or nMOS stack 319, 320, 321 to data output 214. In effect, when there is no collision, bypass circuitry is disabled and sense amplifier 206 is enabled to allow read data from memory array to be amplified and outputted through data output 214.

Figure 4:
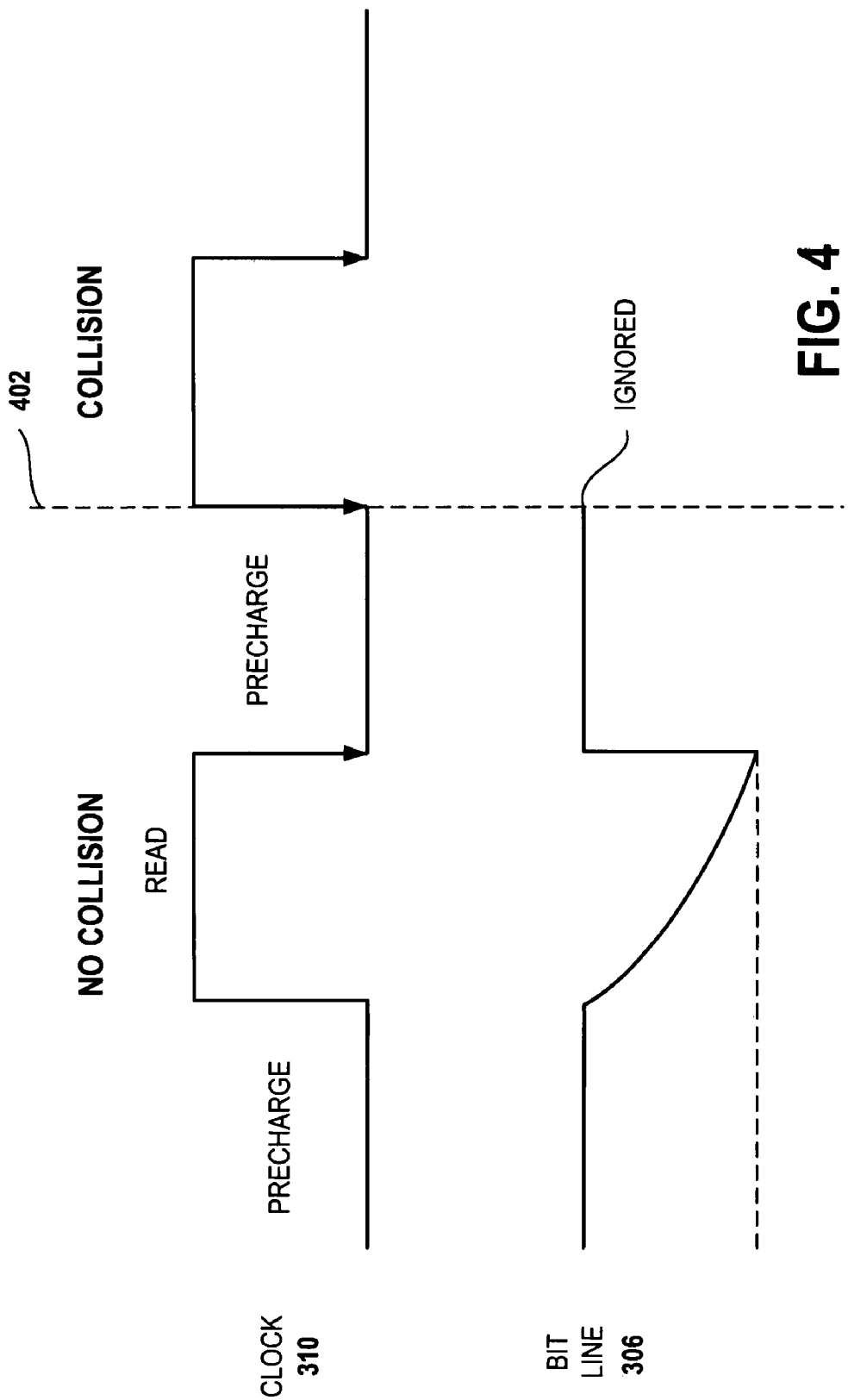
FIG. 4 are timing diagrams of a bit line and a clock, in accordance with one embodiment of the present invention.

FIG. 4 are timing diagrams of a bit line and a clock, in accordance with one embodiment of the present invention. As shown in FIG. 4, the timing diagrams to the left of reference line 402 show cycles when there are no collisions of memory addresses. The timing diagrams to the right of reference line 402 show cycles when there are collisions of memory addresses.

In one embodiment, a read operation for a non-collision cycle begins with bit line 306 precharged to a supply voltage. During a read operation, the memory array reads its value out onto the precharged bit line 306 and establishes a voltage differential by discharging the bit line. The advantage of precharging bit line 306 is that a transistor does not have a delay in transmitting a level of supply voltage from the drain terminal to the source terminal. After a read operation, the voltage on bit line 306 is restored by precharging the bit line to the supply voltage.

Accordingly, as shown in FIG. 4, bit line 306 is initially precharged. It should be appreciated that clock 310 is used for precharging bit line 306 and for enabling a read or write operation. During a read operation, bit line 306 is conditionally discharged to transmit the read data. After the read operation, bit line 306 is precharged to the supply voltage. Bit line precharging may be achieved through clock precharging that precharges bit line 306 at every clock cycle.

When there is a collision of memory addresses, the sense amplifier does not amplify the signals from the memory array. Accordingly, as shown in FIG. 4, the read data from bit line 306 to the right of reference line 402 is not relevant and ignored if there is a collision of memory addresses.

Figure 5:
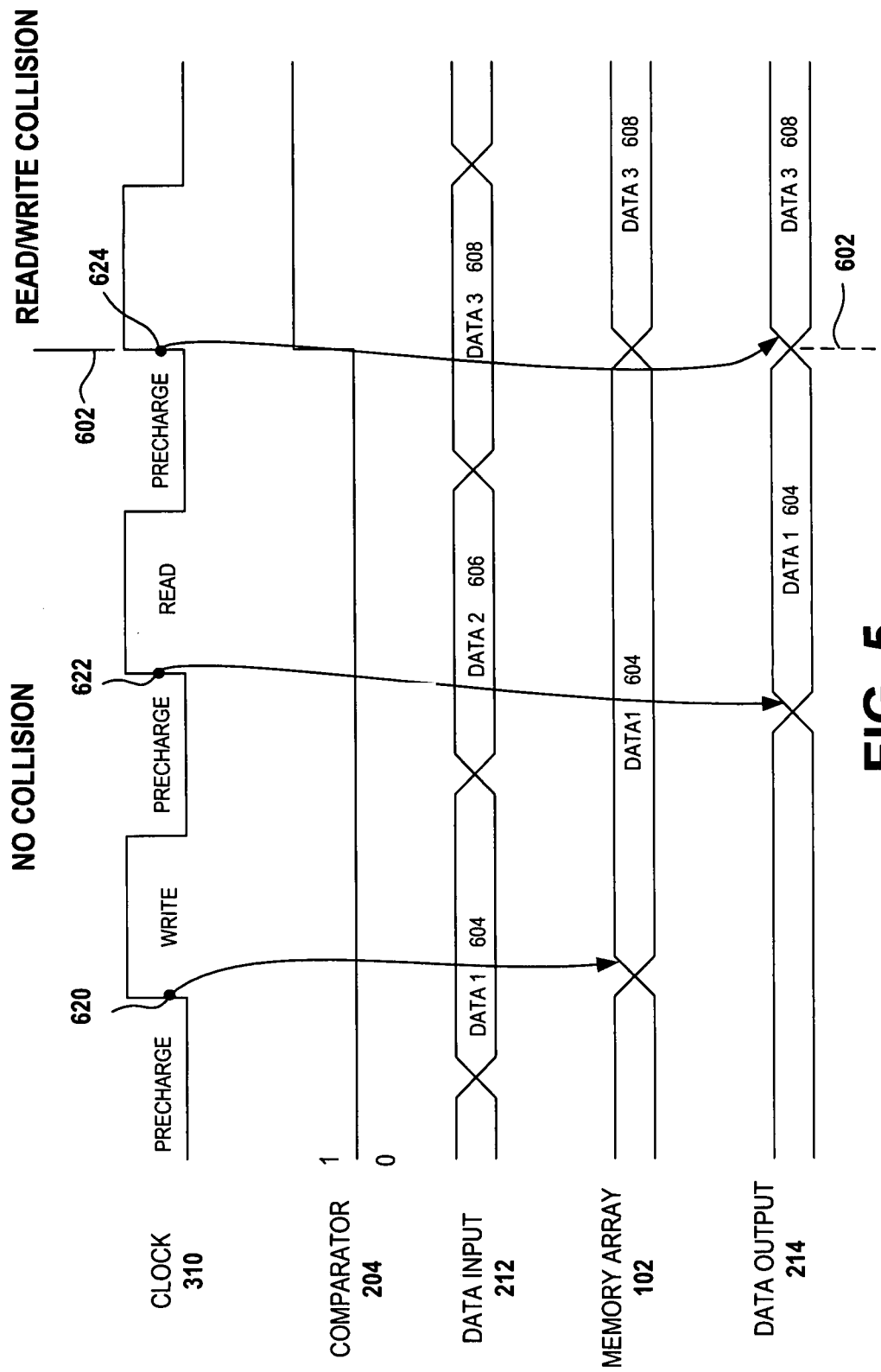
FIG. 5 are timing diagrams of the clock, the comparator, the data input, the memory array, and the data output shown in FIGS. 2 and 3, in accordance with one embodiment of the present invention.

FIG. 5 are timing diagrams of the clock, the comparator, the data input, the memory array, and the data output shown in FIGS. 2 and 3, in accordance with one embodiment of the present invention. As shown in FIG. 5, timing diagram of clock 310 shows read, write, and precharge cycles. Timing diagram of comparator 204 initially shows a 0 value, which indicates no collision, and shows a 1 value, which indicates a collision, after reference line 602. Accordingly, the timing diagrams to the left of reference line 602 shows cycles when there are no collisions of memory addresses. The timing diagrams to the right of reference line 602 shows cycles when there are collisions of memory addresses.

As shown in timing diagram of data input 212, Data 1 604, Data 2 606, and Data 3 608 are initially inputted through the data input for recording into memory array 102. As a result, the content of memory array 102 is changed to Data 1 604 at first rising edge 620 of clock 310 after precharge. The subsequent Data 2 606 cannot be written to memory array 102 because the Data 2 is inputted during a read cycle. Instead, at second rising edge 622 of clock 310, timing diagram of data output 214 shows that Data 1 604 is being outputted from the data output. On the other hand, when there is a collision of memory addresses, at third rising edge 624 of clock 310, Data 3 608 being inputted through data input 212 is directed to data output 214 and, at the same time, the Data 3 is recorded into content of memory array 102.

Figure 6:
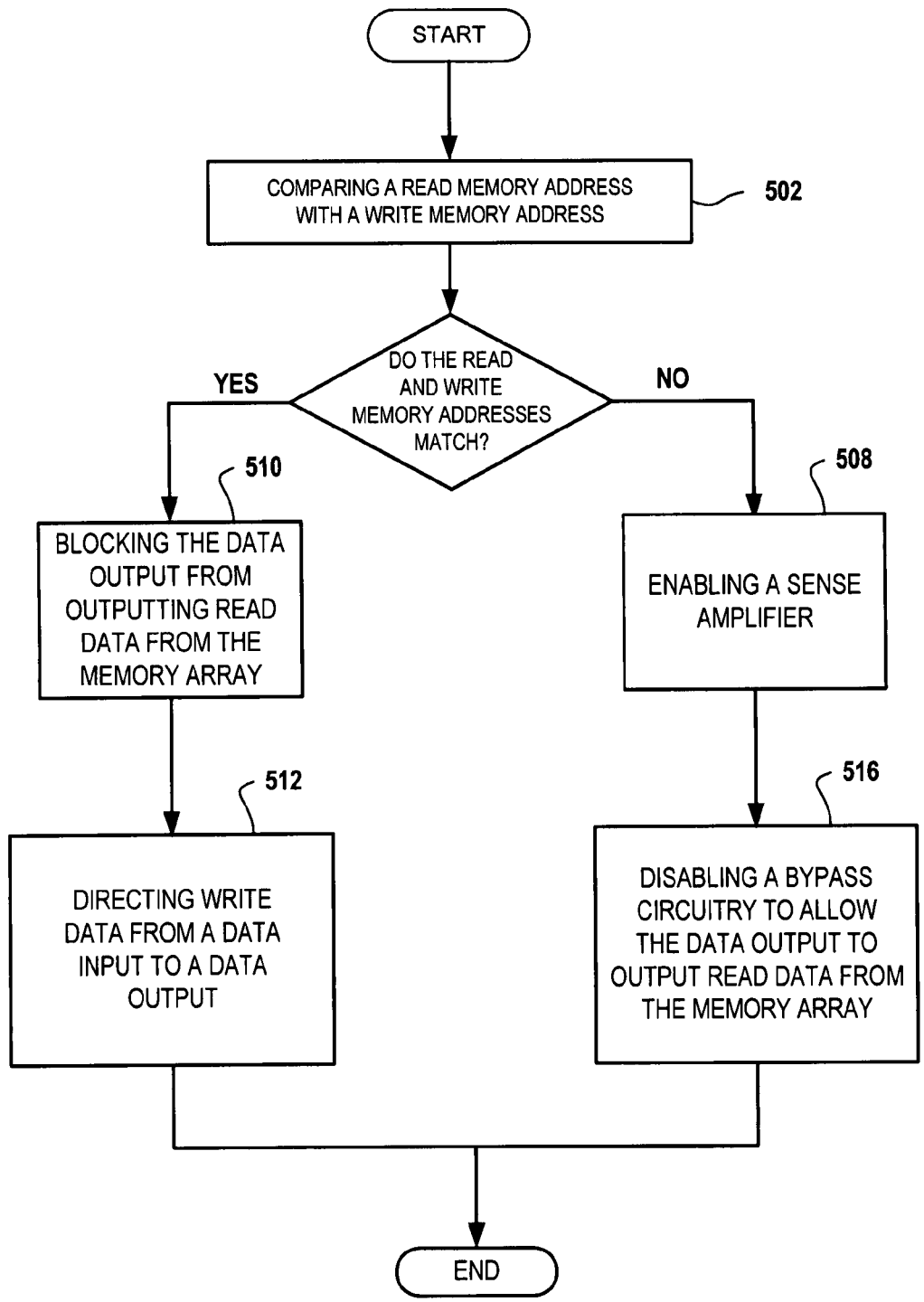
FIG. 6 is a flowchart diagram of a high level overview of a hardware implemented method for resolving collisions of memory addresses of a memory array, in accordance with one embodiment of the present invention.

FIG. 6 is a flowchart diagram of a high level overview of a hardware implemented method for resolving collisions of memory addresses of a memory array, in accordance with one embodiment of the present invention. Starting in operation 502, a read memory address is compared with a write memory address. If the read memory address matches the write memory address, the data output is blocked from outputting read data from the memory array in operation 510. For example, in one embodiment, read data is blocked by disabling a sense amplifier. At the same time, in operation 512, write data from the data input is directed to the data output. For example, in one embodiment, the write data may be directed from a data input to a data output through a bypass circuitry that connects the data input to the data output. While the write data is directed to the data output, the write data still is recorded in the memory array.

On the other hand, if the read memory address differs from the write memory address, the sense amplifier is enabled in operation 508 to amplify the read data signals from the memory array. At the same time, the bypass circuitry is disabled to allow the data output to output the read data from the memory array in operation 516.

One skilled in the art will appreciate that the functionality described for the resolution of collisions of memory addresses with reference to FIG. 6 may be incorporated into an integrated circuit. It will be apparent to one skilled in the art that the functionality described herein may be synthesized into firmware through a suitable hardware description language (HDL). For example, the HDL, e.g., VERILOG, may be employed to synthesize the firmware and layout of the logic gates for providing the necessary functionality described herein to provide a hardware implementation of the collisions resolution techniques and associated functionalities. Thus, the embodiments described herein may be captured in any suitable form or format that accomplishes the functionality herein and is not limited to a particular form or format.

In summary, the above described invention provides systems and methods for resolving collisions of memory addresses during memory access. The inclusion of the bypass circuitry and the resolution of collisions within the memory eliminate the need for external logic to handle indeterministic data as a result of a memory collision. By eliminating external logic, the size of the hardware that accesses the memory may be reduced and the hardware can access the memory faster.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The above described invention may be practiced with other computer system configurations including hand-held devices, microprocessor systems, microprocessor-based or programmable consumer electronics, minicomputers, mainframe computers and the like. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A memory chip having a data input, a data output, circuitries for resolving collisions of memory addresses of a memory array having a bit line, said chip comprising:
    circuitry for comparing a read memory address with a write memory address;
    a sense amplifier coupled to a comparator output of said circuitry and having a sense input coupled to said bit line and a sense output to selectively place data on said bit line at said data output; and
    bypass circuitry coupled to said comparator output, with said bypass circuitry and said sense amplifier coupled together to selectively prevent data on said bit line from being present on said sense output while allowing write data to be written to said memory array and present on a data output, during a common clock cycle, in response to said read and write memory addresses matching, the bypass circuitry including an AND gate having a first input in electrical communication with an output of said sense amplifier and a second input in electrical communication with an output of a NAND gate with said NAND gate having a first input in electrical communication with said comparator output and a second input in electrical communication with an output of an inverter, said inverter having an input in coupled to a data input.

2. The memory chip of claim 1, wherein the bypass circuitry is coupled to receive said data input signal.

3. The memory chip of claim 1 wherein said circuitry for comparing is configured to generate a first signal, in response to said read and write memory addresses differing, to allow said sense amplifier to place data on said bit line at said sense output.

4. The memory chip of claim 1 wherein said bypass circuitry is configured to propagate a signal, in response to said read and write memory addresses matching, from said comparator output to deactivate said sense amplifier.

5. The memory chip of claim 1, wherein the circuitry for comparing the read memory address with the write memory address is a comparator.

6. The memory chip of claim 1, wherein the bypass circuitry includes at least two NAND gates.

7. A memory chip having circuitries for resolving collisions of memory addresses of a memory array, comprising:
    a comparator to receive a read memory address and a write memory address;
    a sense amplifier coupled to a comparator output of said comparator and having a sense input coupled to said bit line and a sense output to selectively place data on said bit line at said data output; and
    bypass circuitry coupled to said comparator output, with said bypass circuitry and said sense amplifier coupled together to concurrently prevent data on said bit line from being present on said sense output while allowing write data to be written to said memory array and present on a data output in response to said comparator producing a first signal and allowing said data on said bit line to be present on said sense output in response to a second signal being generated by said comparator and allowing write data present at said data input to be written to said memory array, the bypass circuitry including an AND gate having a first input in electrical communication with an output of said sense amplifier and a second input in electrical communication with an output of a NAND gate, with said NAND gate having a first input in electrical communication with said comparator output and a second input in electrical communication with an output of an inverter, said inverter having an input in coupled to a data input.

8. The memory chip of claim 7 wherein the bypass circuitry selectively connects the data input to the data output.

9. The memory chip of claim 7 further including circuitry for enabling the sense amplifier to allow the data output to output read data from the memory array if the read and write memory addresses differ.

10. The memory chip of claim 7 wherein said bypass circuitry is coupled to receive said data input signal.

11. The memory chip of claim 7 wherein the circuitry for comparing the read memory address with the write memory address is a comparator.

12. The memory chip of claim 7 wherein the bypass circuitry includes at least two NAND gates.

13. The memory chip of claim 7 wherein said bypass circuitry is configured to propagate a signal, in response to said read and write memory addresses matching, from said comparator output to deactivate said sense amplifier.

14. A memory chip having a data input, a data output, circuitries for resolving collisions of memory addresses of a memory array having a bit line, said chip comprising:
    circuitry for comparing a read memory address with a write memory address, said circuitry having a comparator output;
    a sense amplifier coupled to said a comparator output and having a sense input coupled to said bit line and a sense output to selectively place data on said bit line at said data output; and
    bypass circuitry coupled to said comparator output, with said bypass circuitry and said sense amplifier coupled together to selectively prevent data on said bit line from being present on said sense output while allowing write data to be written to said memory array and present on a data output, during a common clock cycle, in response to said read and write memory addresses matching by a signal propagating from said comparator output to deactivate said sense amplifier in response to said circuitry determining said read memory address matches said write memory address, the bypass circuitry including an AND gate having a first input in electrical communication with an output of said sense amplifier and a second input in electrical communication with an output of a NAND gate, with said NAND gate having a first input in electrical communication with said comparator output and a second input in electrical communication with an output of an inverter said inverter having an input in coupled to a data input.

15. The memory chip of claim 14 wherein said circuitry is configured to generate a first signal, in response to said read and write memory addresses differing, to allow said sense amplifier to place data on said bit line at said sense output.

* * * * *